(12) United States Patent
Huang et al.

(10) Patent No.: US 9,356,205 B2
(45) Date of Patent: May 31, 2016

(54) LIGHT EMITTING COMPONENT

(71) Applicant: Genesis Photonics Inc., Tainan (TW)

(72) Inventors: Kuan-Chieh Huang, Tainan (TW); Shao-Ying Ting, Tainan (TW); Jing-En Huang, Tainan (TW); Yi-Ru Huang, Tainan (TW)

(73) Assignee: Genesis Photonics Inc., Shanhua Dist., Tainan (TW)

( * ) Notice: Subject to any disclaimer, the term of this patent is extended or adjusted under 35 U.S.C. 154(b) by 0 days.

(21) Appl. No.: 14/462,581

(22) Filed: Aug. 19, 2014

(65) Prior Publication Data
US 2015/0364660 A1 Dec. 17, 2015

(30) Foreign Application Priority Data
Jun. 12, 2014 (TW) ............................... 103120334 A

(51) Int. Cl.
*H01L 33/50* (2010.01)
*H01L 33/60* (2010.01)

(52) U.S. Cl.
CPC .............. *H01L 33/505* (2013.01); *H01L 33/60* (2013.01)

(58) Field of Classification Search
None
See application file for complete search history.

(56) References Cited

U.S. PATENT DOCUMENTS

2011/0198780 A1* 8/2011 Basin et al. ................... 264/266
2012/0250320 A1* 10/2012 Harbers et al. ............... 362/247

FOREIGN PATENT DOCUMENTS

JP    2011114093    * 6/2011
TW    200841089      10/2008

OTHER PUBLICATIONS

The machine translation of Nishioka (JP 2011-114093).*

* cited by examiner

*Primary Examiner* — Yasser A Abdelaziez
(74) *Attorney, Agent, or Firm* — Winston Hsu; Scott Margo

(57) ABSTRACT

A light emitting component includes a light emitting unit, a molding compound and a wavelength converting layer. The light emitting unit has a forward light emitting surface. The molding compound covers the light emitting unit. The wavelength converting layer is disposed above the molding compound. The wavelength converting layer has a first surface and a second surface opposite to the first surface, wherein the first surface is located between the forward light emitting surface and the second surface, and at least one of the first and second surfaces is non-planar.

14 Claims, 7 Drawing Sheets

LIGHT EMITTING COMPONENT

BACKGROUND OF THE INVENTION

1. Field of the Invention

The invention relates to a light emitting component and, more particularly, to a light emitting component having a wavelength converting layer with at least one non-planar surface.

2. Description of the Prior Art

Referring to FIG. 1, FIG. 1 is a schematic view illustrating a light emitting component 1 of the prior art. As shown in FIG. 1, the light emitting component 1 comprises a light emitting diode 10 and a phosphor member 12. The phosphor member 12 is formed on the light emitting diode 10 by a dispensing process or a spraying process, so as to package the light emitting diode 10. In general, the phosphor member 12 contains phosphor powders for converting light emitted by the light emitting diode 10 into a desired light color. As shown in FIG. 1, since the phosphor member 12 covers the light emitting diode 10 directly, a decrease in light intensity may occur in the phosphor powders of the phosphor member 12 due to heat generated by the light emitting diode 10. Furthermore, since a surface 120 of the phosphor member 12 is planar, total reflection may occur easily while the light emitted by the light emitting diode 10 passes through the surface 120. Moreover, the phosphor powders excited by the light of the light emitting diode 10 at the surface 120 are limited, such that the quantity of light output is limited accordingly.

SUMMARY OF THE INVENTION

The invention provides a light emitting component having a wavelength converting layer with at least one non-planar surface, so as to solve the aforesaid problems.

According to an embodiment of the invention, a light emitting component comprises a light emitting unit, a molding compound and a wavelength converting layer. The light emitting unit has a forward light emitting surface. The molding compound covers the light emitting unit. The wavelength converting layer is disposed above the molding compound. The wavelength converting layer has a first surface and a second surface opposite to the first surface, wherein the first surface is located between the forward light emitting surface and the second surface, and at least one of the first and second surfaces is non-planar.

Preferably, the first surface contacts the molding compound and is non-planar.

Preferably, the second surface is non-planar.

Preferably, the light emitting component further comprises a light transmissible member disposed on the wavelength converting layer, wherein the second surface contacts the light transmissible member and is planar.

Preferably, the light emitting component further comprises a light transmissible member disposed between the molding compound and the wavelength converting layer, wherein the first surface contacts the light transmissible member and is planar, and the second surface is non-planar.

Preferably, the wavelength converting layer is capable of deforming when a mechanical force is exerted on the wavelength converting layer.

Preferably, the light emitting component further comprises a reflective layer disposed on a side light emitting surface of the light emitting unit around the forward light emitting surface.

As mentioned in the above, the invention disposed the wavelength converting layer above the molding compound, such that the wavelength converting layer does not contact the light emitting unit, so as to prevent the decrease in light intensity from occurring in the phosphor powders of the wavelength converting layer due to heat generated by the light emitting unit. Furthermore, at least one of the first and second surfaces of the wavelength converting layer is non-planar. When the first surface of the wavelength converting layer, which contacts the molding compound, is non-planar, the contact area between the wavelength converting layer and the molding compound increases, such that the phosphor powders excited by the light of the light emitting unit at the first surface increase, so as to enhance the quantity of light output. When the second surface of the wavelength converting layer, which does not contact the molding compound, is non-planar, the total reflection can be reduced while the light emitted by the light emitting unit passes through the second surface. Still further, the invention may dispose the light transmissible member on the wavelength converting layer or between the molding compound and the wavelength converting layer, wherein the light transmissible member is used for guiding the light emitted by the light emitting unit, so as to enhance the quantity of light output. In addition, the light transmissible member may solidify the light emitting component. Moreover, the invention may dispose the reflective layer on the side light emitting surface of the light emitting unit to reflect the light emitted by the side light emitting surface of the light emitting unit, so as to enhance the quantity of light output.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
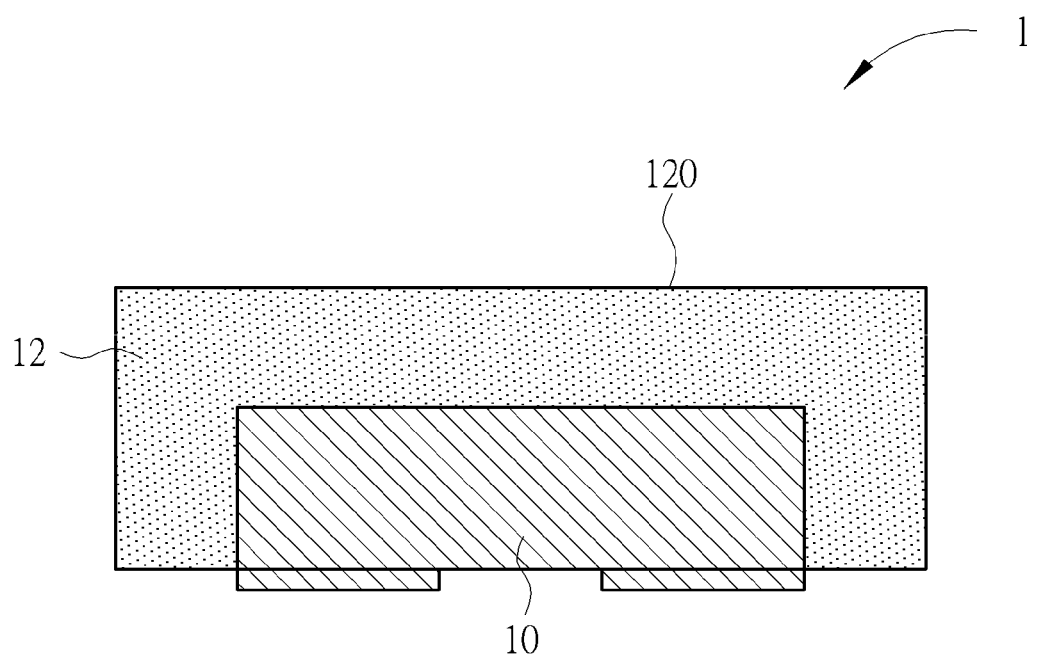
FIG. 1 is a schematic view illustrating a light emitting component of the prior art.
Figure 2:
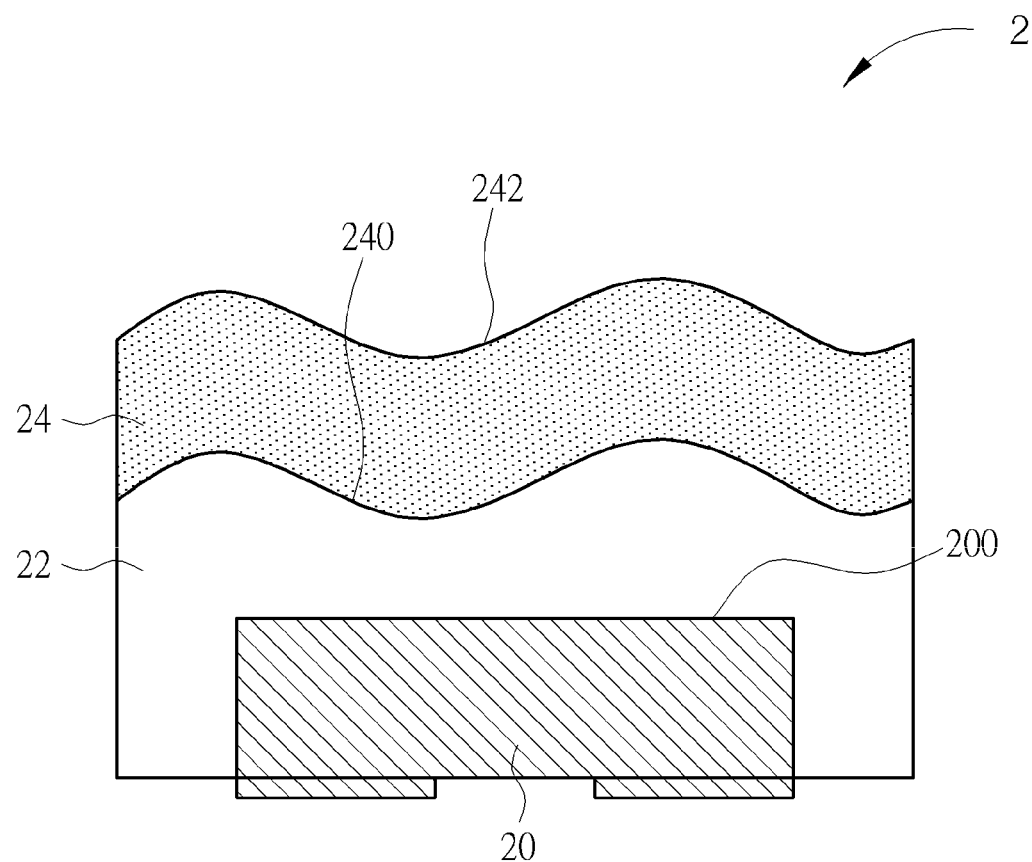
FIG. 2 is a schematic view illustrating a light emitting component according to a first embodiment of the invention.

Referring to FIG. 2, FIG. 2 is a schematic view illustrating a light emitting component 2 according to a first embodiment of the invention. As shown in FIG. 2, the light emitting component 2 comprises a light emitting unit 20, a molding compound 22 and a wavelength converting layer 24. The light emitting unit 20 has a forward light emitting surface 200. The molding compound 22 covers the light emitting unit 20. The wavelength converting layer 24 is disposed above the molding compound 22. The wavelength converting layer 24 has a first surface 240 and a second surface 242 opposite to the first surface 240, wherein the first surface 240 is located between the forward light emitting surface 200 and the second surface 242.

In this embodiment, the light emitting unit 20 may be, but not limited to, a light emitting diode. A material of the molding compound 22 may be silicone, epoxy or other molding compounds. The wavelength converting layer 24 may be made of a mixture of a transparent glue and phosphor powders. The wavelength converting layer 24 may convert a wavelength of the light emitted by the light emitting unit 20 into another wavelength, so as to change the light color of the light emitting unit 20.

As shown in FIG. 2, the first surface 240 of the wavelength converting layer 24 contacts the molding compound 22 and is non-planar. Furthermore, the second surface 242 of the wavelength converting layer 24 is also non-planar. In this embodiment, the first surface 240 and the second surface 242 of the wavelength converting layer 24 may be wave-shaped. However, in another embodiment, the first surface 240 and the second surface 242 of the wavelength converting layer 24 may be saw-toothed, scraggy or other regular/irregular shapes according to practical applications.

In this embodiment, the wavelength converting layer 24 may be made through, but not limited to, the disclosure of Taiwan Patent Application No. 102132241. Specifically, the wavelength converting layer 24 of the invention is capable of deforming when a mechanical force is exerted on the wavelength converting layer 24. In other words, the wavelength converting layer 24 is flexible. Accordingly, a non-planar surface may be formed between the wavelength converting layer 24 and the molding compound 22 through a bonding process or other simple processes without a complicated semiconductor process when the first surface 240 of the wavelength converting layer 24 contacts the molding compound 22.

Figure 3:
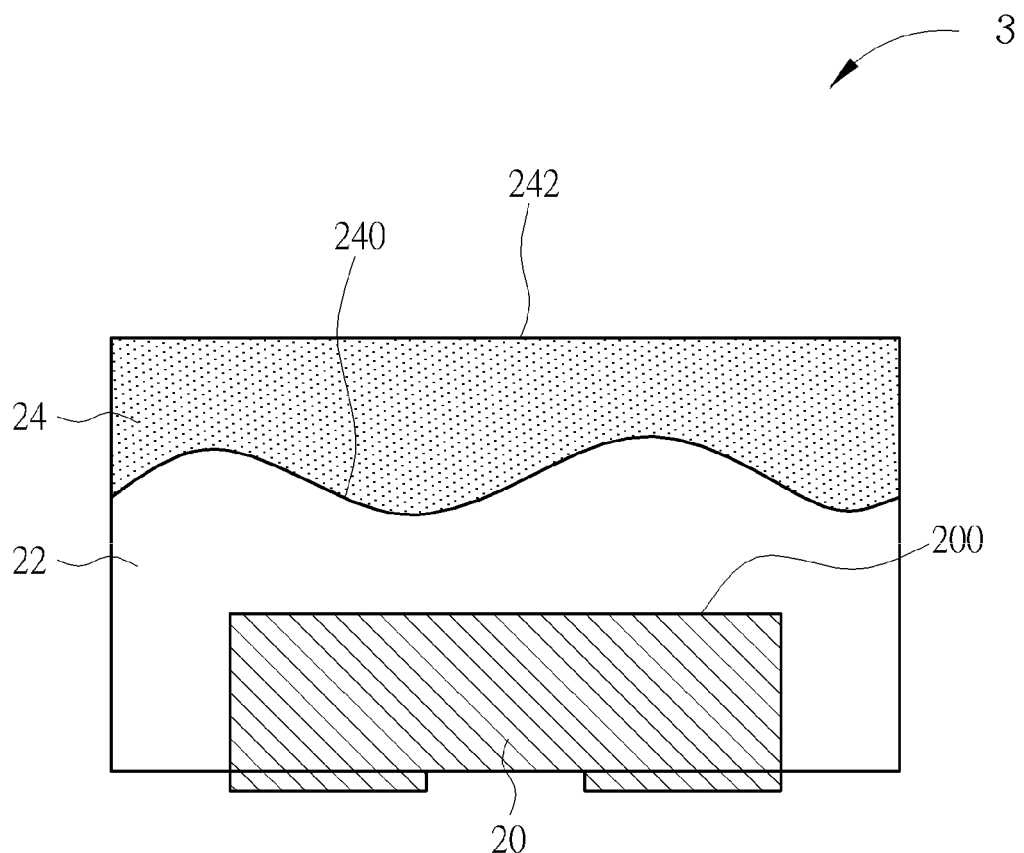
FIG. 3 is a schematic view illustrating a light emitting component according to a second embodiment of the invention.

Referring to FIG. 3 along with FIG. 2, FIG. 3 is a schematic view illustrating a light emitting component 3 according to a second embodiment of the invention. The main difference between the light emitting component 3 and the aforesaid light emitting component 2 is that the second surface 242 of the wavelength converting layer 24 of the light emitting component 3 is planar. It should be noted that the same elements in FIG. 3 and FIG. 2 are represented by the same numerals, so the repeated explanation will not be depicted herein again.

Figure 4:
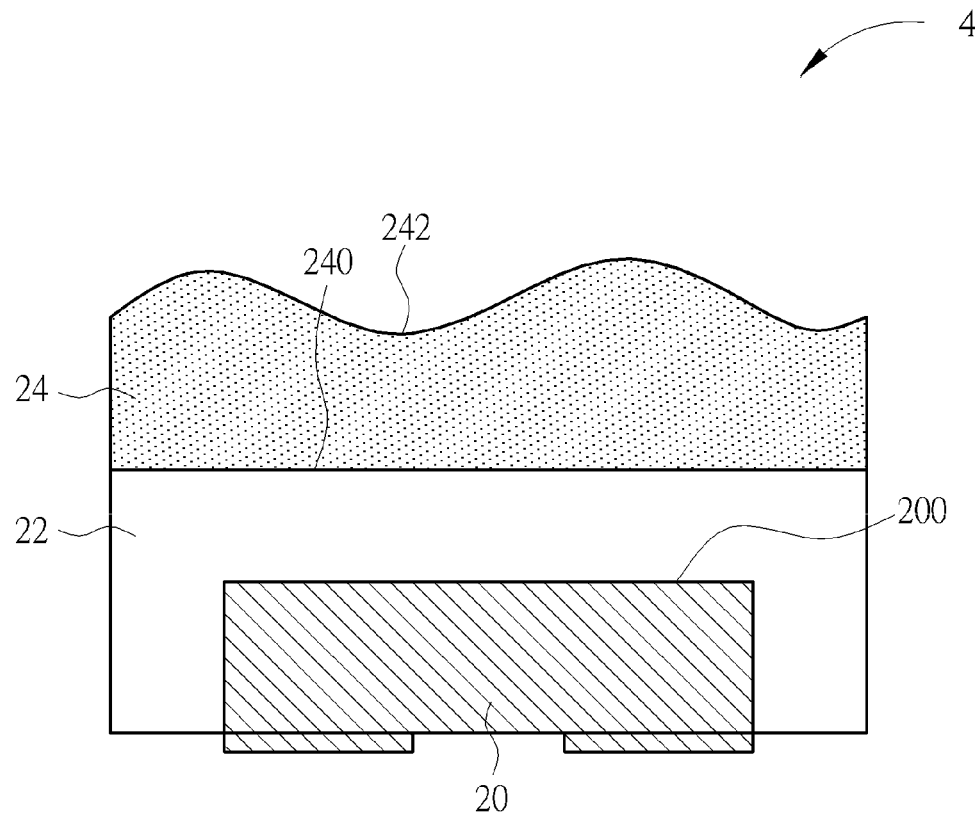
FIG. 4 is a schematic view illustrating a light emitting component according to a third embodiment of the invention.

Referring to FIG. 4 along with FIG. 2, FIG. 4 is a schematic view illustrating a light emitting component 4 according to a third embodiment of the invention. The main difference between the light emitting component 4 and the aforesaid light emitting component 2 is that the first surface 240 of the wavelength converting layer 24 of the light emitting unit 4 is planar. It should be noted that the same elements in FIG. 4 and FIG. 2 are represented by the same numerals, so the repeated explanation will not be depicted herein again.

As the light emitting components 2, 3 and 4 shown in FIGS. 2 to 4, the invention may make at least one of the first surface 240 and the second surface 242 of the wavelength converting layer 24 to be non-planar according to practical applications. When the first surface 240 of the wavelength converting layer 24, which contacts the molding compound 22, is non-planar, the contact area between the wavelength converting layer 24 and the molding compound 22 increases (e.g. the non-planar contact area of the invention may be 1.1 times the planar contact are of the prior art), such that the phosphor powders excited by the light of the light emitting unit 20 at the first surface 240 increase, so as to enhance the quantity of light output. When the second surface 242 of the wavelength converting layer 24, which does not contact the molding compound 22, is non-planar, the total reflection can be reduced while the light emitted by the light emitting unit 20 passes through the second surface 242. Moreover, the invention disposed the wavelength converting layer 24 above the molding compound 22, such that the wavelength converting layer 24 does not contact the light emitting unit 20, so as to prevent the decrease in light intensity from occurring in the phosphor powders of the wavelength converting layer 24 due to heat generated by the light emitting unit 20.

Figure 5:
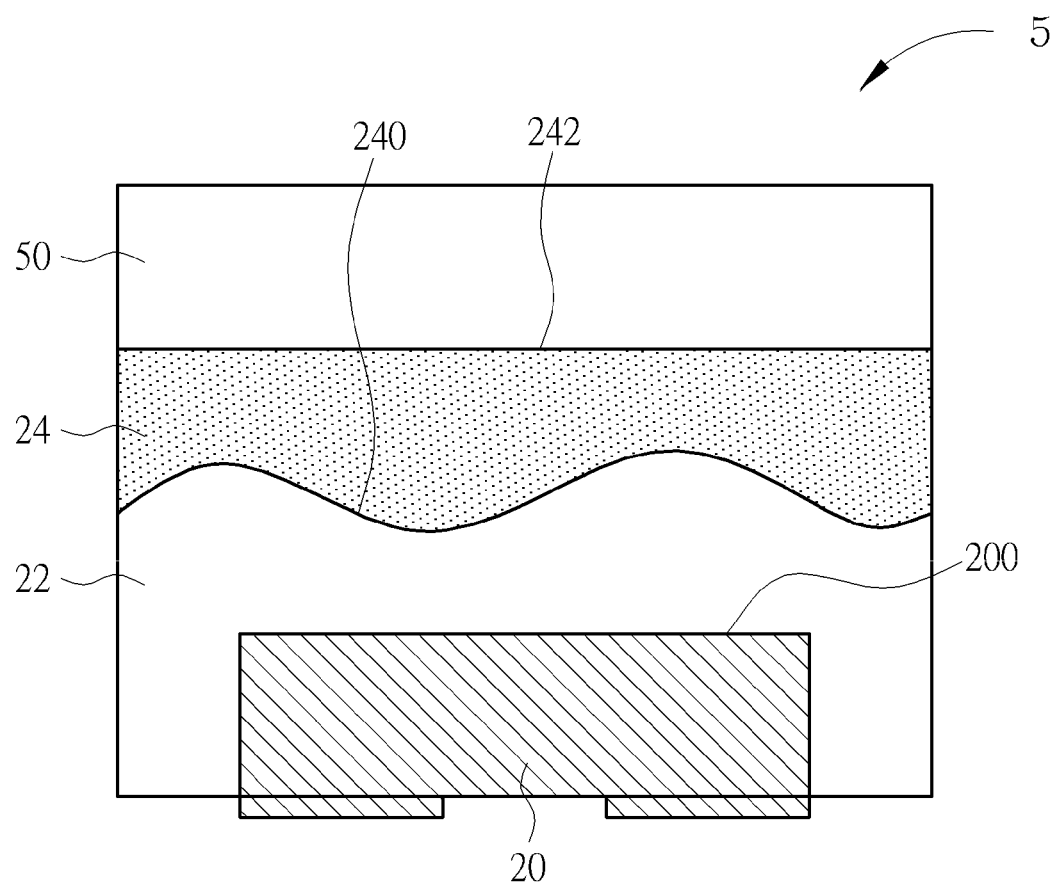
FIG. 5 is a schematic view illustrating a light emitting component according to a fourth embodiment of the invention.

Referring to FIG. 5 along with FIG. 2, FIG. 5 is a schematic view illustrating a light emitting component 5 according to a fourth embodiment of the invention. The main difference between the light emitting component 5 and the aforesaid light emitting component 2 is that the light emitting component 5 further comprises a light transmissible member 50. As shown in FIG. 5, the light transmissible member 50 is disposed on the wavelength converting layer 24, wherein the second surface 242 of the wavelength converting layer 24 contacts the light transmissible member 50 and is planar. In this embodiment, the light transmissible member 50 is used for guiding the light emitted by the light emitting unit 20, so as to enhance the quantity of light output. In addition, the light transmissible member 50 may solidify the light emitting component 5. Furthermore, a material of the light transmissible member 50 may be glass, sapphire or other light transmissible materials. Specifically, since the wavelength converting layer 24 of the invention is capable of deforming when a mechanical force is exerted on the wavelength converting layer 24, the invention may dispose the wavelength converting layer 24 on the light transmissible member 50 first, dispose the light transmissible member 50 on the molding compound 22, and then perform a bonding process or the like to form the non-planar first surface 240. Accordingly, the invention can save manufacture time and cost. It should be noted that the same elements in FIG. 5 and FIG. 2 are represented by the same numerals, so the repeated explanation will not be depicted herein again.

Figure 6:
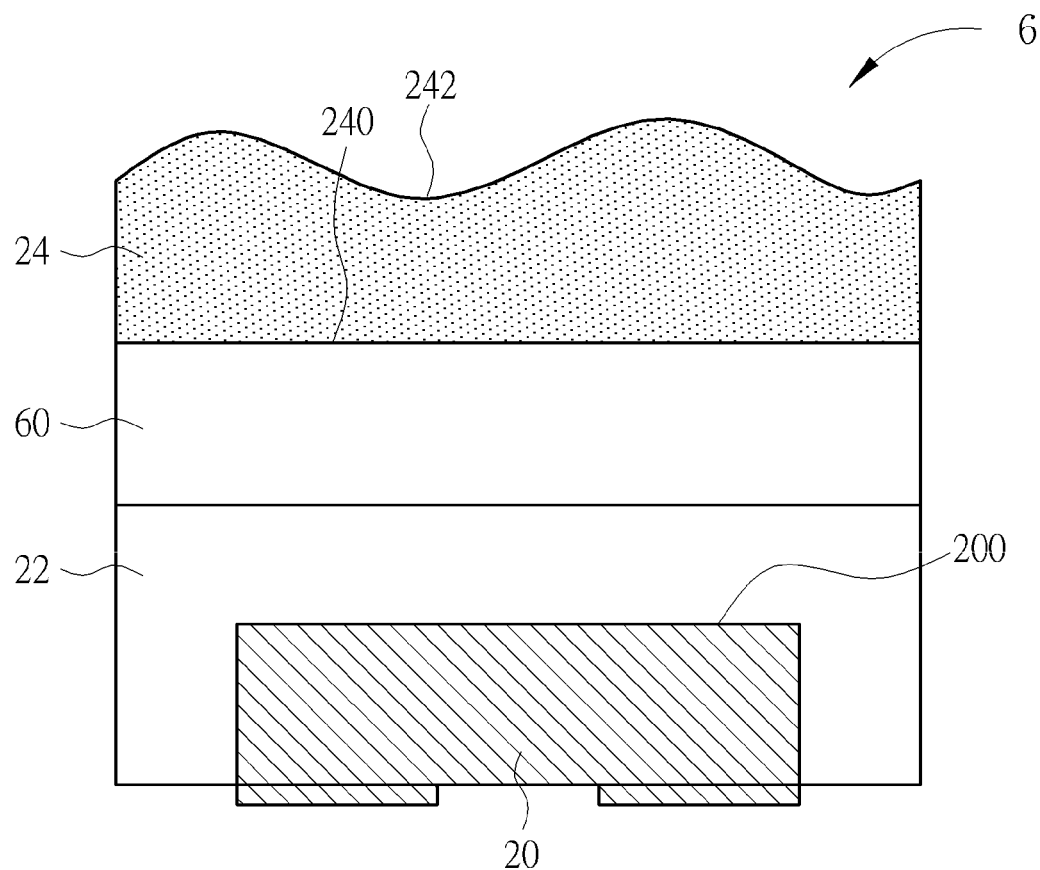
FIG. 6 is a schematic view illustrating a light emitting component according to a fifth embodiment of the invention.

Referring to FIG. 6 along with FIG. 2, FIG. 6 is a schematic view illustrating a light emitting component 6 according to a fifth embodiment of the invention. The main difference between the light emitting component 6 and the aforesaid light emitting component 2 is that the light emitting component 6 further comprises a light transmissible member 60. As shown in FIG. 6, the light transmissible member 60 is disposed between the molding compound 22 and the wavelength converting layer 24, wherein the first surface 240 of the wavelength converting layer 24 contacts the light transmissible member 60 and is planar, and the second surface 242 is non-planar. In this embodiment, the light transmissible member 60 is used for guiding the light emitted by the light emitting unit 20, so as to enhance the quantity of light output. In addition, the light transmissible member 60 may solidify the light emitting component 6. Furthermore, a material of the light transmissible member 60 may be glass, sapphire or other light transmissible materials. It should be noted that the same elements in FIG. 6 and FIG. 2 are represented by the same numerals, so the repeated explanation will not be depicted herein again.

Figure 7:
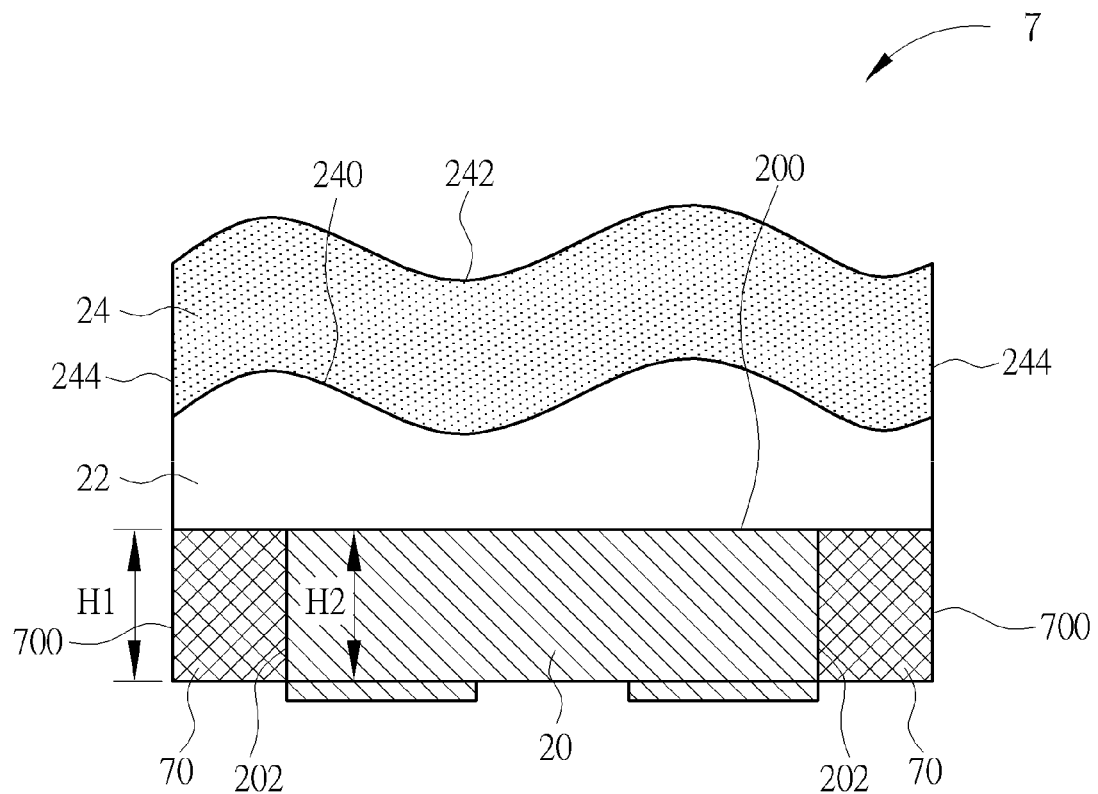
FIG. 7 is a schematic view illustrating a light emitting component according to a sixth embodiment of the invention.

Referring to FIG. 7 along with FIG. 2, FIG. 7 is a schematic view illustrating a light emitting component 7 according to a sixth embodiment of the invention. The main difference between the light emitting component 7 and the aforesaid light emitting component 2 is that the light emitting component 7 further comprises a reflective layer 70. As shown in FIG. 7, the reflective layer 70 is disposed on a side light emitting surface 202 of the light emitting unit 20 around the forward light emitting surface 200. In this embodiment, the reflective layer 70 can reflect the light emitted by the side light emitting surface 202 of the light emitting unit 20, so as to enhance the quantity of light output. Preferably, a vertical height H1 of the reflective layer 70 may be larger than or equal to a vertical height H2 of the side light emitting surface 202 of the light emitting unite 20, so as to reflect the light emitted by the side light emitting surface 202 of the light emitting unit 20 effectively. Furthermore, a side surface 700 of the reflective layer 70 and a side surface 244 of the wavelength converting layer 24 may be coplanar. Still further, a material of the reflective layer 70 may comprise polymer material (e.g. silicone, epoxy, etc.), metal oxide material (e.g. $TiO_2$, $ZrO_2$, $Al_2O_3$, ZnO, etc.), metal material (e.g. Al, Ag, etc.) or a combination thereof. Preferably, the material of the reflective layer 70 may be the combination of the polymer material and the metal oxide material, so as to reduce the cost and simplify the process. It should be noted that the same elements in FIG. 7 and FIG. 2 are represented by the same numerals, so the repeated explanation will not be depicted herein again.

As mentioned in the above, the invention disposed the wavelength converting layer above the molding compound, such that the wavelength converting layer does not contact the light emitting unit, so as to prevent the decrease in light intensity from occurring in the phosphor powders of the wavelength converting layer due to heat generated by the light emitting unit. Furthermore, at least one of the first and second surfaces of the wavelength converting layer is non-planar. When the first surface of the wavelength converting layer, which contacts the molding compound, is non-planar, the contact area between the wavelength converting layer and the molding compound increases, such that the phosphor powders excited by the light of the light emitting unit at the first surface increase, so as to enhance the quantity of light output. When the second surface of the wavelength converting layer, which does not contact the molding compound, is non-planar, the total reflection can be reduced while the light emitted by the light emitting unit passes through the second surface. Still further, the invention may dispose the light transmissible member on the wavelength converting layer or between the molding compound and the wavelength converting layer, wherein the light transmissible member is used for guiding the light emitted by the light emitting unit, so as to enhance the quantity of light output. In addition, the light transmissible member may solidify the light emitting component. Moreover, the invention may dispose the reflective layer on the side light emitting surface of the light emitting unit to reflect the light emitted by the side light emitting surface of the light emitting unit, so as to enhance the quantity of light output.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light emitting component comprising:
a light emitting unit having a forward light emitting surface;
a molding compound covering the light emitting unit;
a wavelength converting layer disposed above the molding compound, the wavelength converting layer having a first surface and a second surface opposite to the first surface, the first surface being located between the forward light emitting surface and the second surface; and
a light transmissible member disposed on the wavelength converting layer;
wherein the first surface contacts the molding compound and is non-planar, and the second surface contacts the light transmissible member and is planar.

2. A light emitting component comprising:
a light emitting unit having a forward light emitting surface;
a molding compound covering the light emitting unit;
a wavelength converting layer disposed above the molding compound, the wavelength converting layer having a first surface and a second surface opposite to the first surface, the first surface being located between the forward light emitting surface and the second surface; and
a light transmissible member disposed between the molding compound and the wavelength converting layer, wherein the first surface contacts the light transmissible member and is planar, and the second surface is non-planar.

3. The light emitting component of claim 1, wherein the wavelength converting layer is capable of deforming when a mechanical force is exerted on the wavelength converting layer.

4. The light emitting component of claim 1, further comprising a reflective layer disposed on a side light emitting surface of the light emitting unit around the forward light emitting surface.

5. The light emitting component of claim 4, wherein a side surface of the reflective layer and a side surface of the wavelength converting layer are coplanar.

6. The light emitting component of claim 4, wherein a material of the reflective layer comprises a polymer material, a metal oxide material, a metal material or a combination thereof.

7. The light emitting component of claim 2, wherein the wavelength converting layer is capable of deforming when a mechanical force is exerted on the wavelength converting layer.

8. The light emitting component of claim 2, further comprising a reflective layer disposed on a side light emitting surface of the light emitting unit around the forward light emitting surface.

9. The light emitting component of claim 8, wherein a side surface of the reflective layer and a side surface of the wavelength converting layer are coplanar.

10. The light emitting component of claim 8, wherein a material of the reflective layer comprises a polymer material, a metal oxide material, a metal material or a combination thereof.

11. A light emitting component comprising:
a light emitting unit having a forward light emitting surface;
a molding compound covering the light emitting unit;
a wavelength converting layer disposed above the molding compound, the wavelength converting layer having a first surface and a second surface opposite to the first surface, the first surface being located between the forward light emitting surface and the second surface, at least one of the first and second surfaces being non-planar; and
a reflective layer disposed on a side light emitting surface of the light emitting unit around the forward light emitting surface;
wherein a side surface of the reflective layer and a side surface of the wavelength converting layer are coplanar.

12. The light emitting component of claim 11, wherein the first surface contacts the molding compound and is non-planar.

13. The light emitting component of claim 11, wherein the wavelength converting layer is capable of deforming when a mechanical force is exerted on the wavelength converting layer.

14. The light emitting component of claim 11, wherein a material of the reflective layer comprises a polymer material, a metal oxide material, a metal material or a combination thereof.

* * * * *